Nov. 13, 1956 G. B. HERZOG 2,770,728

SEMI-CONDUCTOR FREQUENCY MULTIPLIER CIRCUIT

Filed July 26, 1954

INVENTOR.
GERALD B. HERZOG
BY H. L. Newton
ATTORNEY

United States Patent Office 2,770,728

Patented Nov. 13, 1956

2,770,728

SEMI-CONDUCTOR FREQUENCY MULTIPLIER CIRCUIT

Gerald B. Herzog, Princeton, N. J., assignor to Radio Corporation of America, a corporation of Delaware Application July 26, 1954, Serial No. 445,607

14 Claims. (Cl. 250—36)

Figure 1:
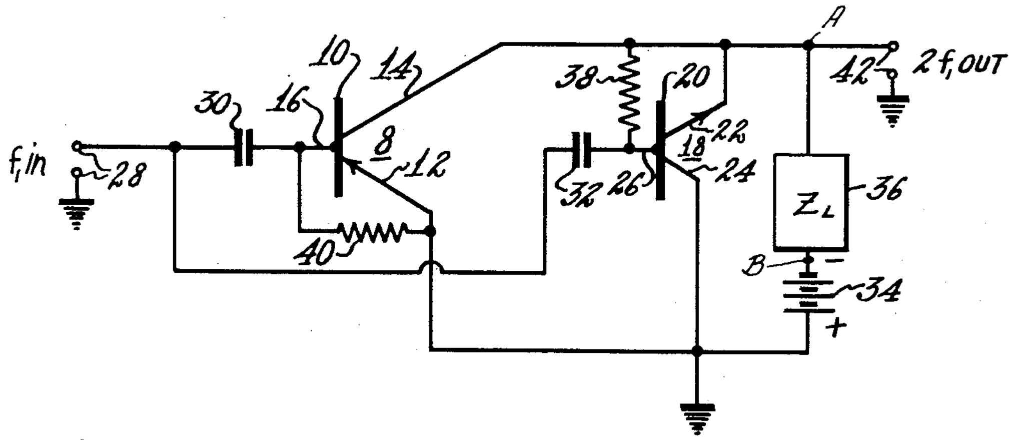

This invention relates in general to frequency multiplier circuits and in particular to circuits of that type which utilize semi-conductor devices such as transistors.

Frequency multiplier circuits are often used to obtain signals of higher frequencies than those which can be obtained, for example, from crystal-controlled oscillator circuits. Circuits of this type may find wide application in radio signal transmitters, particularly of the frequency modulated type, as well as in other types of signal communication equipment. They may be also used advantageously in frequency standard equipment, and may be used in color television receiving systems.

One known type of frequency multiplier circuit is the so-called push-push multiplier. In this type circuit, two electron tubes are used and like current pulses flow in the output circuit corresponding to each half cycle of the signal which is applied to the input circuit. Push-push multiplier circuits are most often used as frequency doublers or quadruplers since only even order harmonics tend to appear in the output signal. In addition, push-push frequency multiplier circuits generally provide excellent frequency discrimination and relatively large power output.

In the known frequency multiplier circuits of the push-push type utilizing electron tubes, a balanced or push-pull driving source is required to energize the grid of the two electron tubes with voltages which are equal in instantaneous amplitude and opposite in instantaneous polarity. This driving source may be relatively costly since it usually includes a push-pull input transformer or an electron tube phase inverter circuit.

Transistors may be adapted to push-push frequency multiplier circuits of the type referred to. Transistors, however, as distinguished from electron tubes, may be of opposite conductivity or complementary symmetry types. This feature of transistors is disclosed, for example, in an article by George C. Sziklai in the June 1953 "Proceedings of the I. R. E.," pages 717–724. This characteristic of transistors, for which there is no known electron tube equivalent, may be utilized, in accordance with the present invention, to provide improved and novel frequency multiplier circuits.

It is, accordingly, an object of the present invention to provide a frequency multiplier circuit utilizing opposite conductivity transistors for improved and efficient operation thereof.

It is another object of the present invention to provide a reliable and efficient semi-conductor push-push frequency multiplier circuit which may operate directly from a single-ended driving source.

These and further objects and advantages of the present invention are achieved, in general, by connecting a pair of opposite conductivity transistors effectively in parallel and driving both transistors with a common signal of predetermined frequency. Because of the complementary conduction characteristics of the transistors an output signal is obtained across a load circuit which is twice the frequency of the common input signal.

Figure 3:
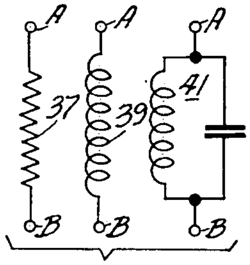
Figure 2:
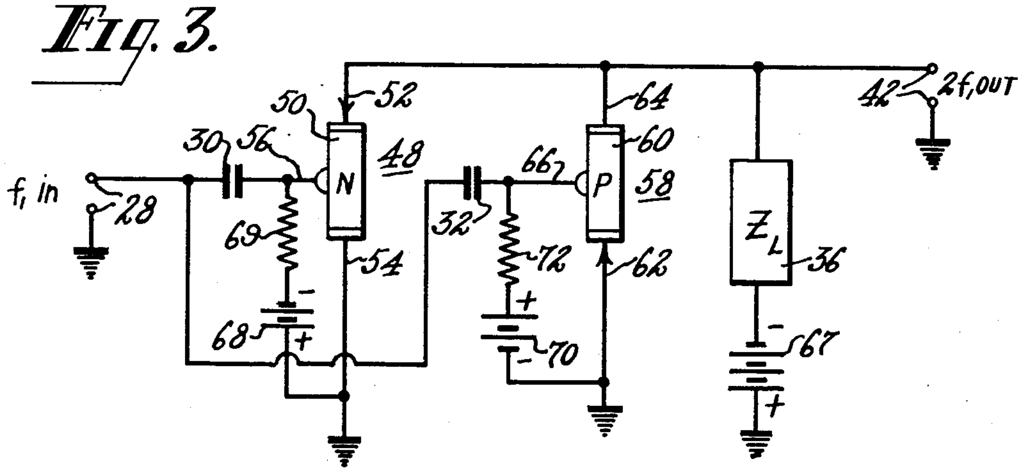

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of frequency multiplier circuits utilizing a pair of opposite conductivity junction transistors and opposite conductivity unipolar transistors respectively, in accordance with the invention, and Figure 3 illustrates various load circuits for the circuits of Figures 1 and 2.

Referring now to the drawing wherein like parts are indicated by like reference numerals in both figures, and referring particularly to Figure 1, a frequency multiplier circuit comprises a pair of transistors 8 and 18. The transistors 8 and 18 are, by way of example, junction transistors although other types having similar characteristics could be used if desired. Moreover, the transistors 8 and 18 are of opposite conductivity types. Accordingly, the transistor 8 may be considered to be of the so-called N type conductivity, i. e., a P–N–P junction type transistor, while the transistor 18 may be considered to be of the so-called P type conductivity, i. e., an N–P–N junction type transistor. It should also be noted that the specific conductivity type of each transistor is not critical so long as they are of opposite conductivity or complementary symmetry types. Accordingly, the transistor 8 could be of the N–P–N junction type while the transistor 18 could be of the P–N–P type if the polarity of the source of biasing voltages were reversed.

The transistors 8 and 18 each comprise a semi-conductive body having three electrodes which are cooperatively associated with the body in a well known manner. Thus, the P–N–P transistor 8 includes a semi-conductive body 10 and an emitter 12, a collector 14 and a base 16. Similarly, the N–P–N transistor 18 includes a semi-conductive body 20 and an emitter 22, a collector 24 and a base 26.

As was mentioned hereinbefore, the transistors 8 and 18 are connected effectively in parallel. Accordingly, the P–N–P transistor 8 is connected for grounded emitter operation as shown, while the N–P–N transistor 18 has its collector 24 connected to a source of fixed reference potential or ground for the system as shown. The emitter 12 of the P–N–P transistor 8 and the collector 24 of the N–P–N transistor 18 are thus referred to as being common electrodes for the transistors 8 and 18 respectively. The output or collector electrode 14 of the P–N–P transistor 8 is connected directly with the output or emitter electrode 22 of the N–P–N transistor 18.

An input signal, such as a sine wave signal, having a frequency of $f_1$ may be applied to the frequency multiplier circuit at the terminals 28, one of which is grounded as shown. Normally, the input signal source will be a high impedance source, and this choice of the impedance of the input signal source is to be preferred for reduced distortion. The input signal is applied, in accordance with the invention, to the input or base electrode 16 of the P–N–P transistor 8 through the coupling capacitor 30. Similarly, the input signal is also applied through a coupling capacitor 32 to the base 26 of the N–P–N transistor 18. Thus, when an input signal is applied to the terminals 28, it will be effective to drive both transistors.

To properly bias the transistors 8 and 18, a source of direct current voltage, such as illustrated by a biasing battery 34, the positive terminal of which is grounded, has its negative terminal connected through a load 36 to the emitter 22 of the transistor 18 and to the collector 14 of the transistor 8. The load 36 may be, for example, a resistor 37 or an inductor 39 as shown in Figure 3 which would be connected between the terminals A and B. Alternately, the load 36 may be a tuned circuit, such as a parallel resonant circuit 41 comprising an inductor and a shunt capacitor as shown in Figure 3, which is tuned to an even multiple of the input frequency and preferably to twice the frequency of the input signal. The proper static operating point of both the transistors is also established by a resistor 40 which is connected between the base 16 and the emitter 12 of the transistor 8, and a further resistor 38 which is connected between the base 26 and the emitter 22 of the transistor 18. By properly choosing the values of these resistors and also the biasing battery 34 the bias on each of the transistors is initially set to be substantially zero, although the biasing between the emitter and base electrodes of each of the transistors may be slightly in the forward direction.

In operation, it is assumed that the biasing voltages for each of the transistors is substantially zero so that each is non-conductive in the absence of an applied signal. Assume further that a sine wave signal is applied to the input terminals 28. Consider then the positive half cycle of the applied sine wave. When a positive signal is applied to the base 16 of the transistor 8 it will remain non-conductive. The application of a positive signal to the base 26 of the N–P–N transistor 18 will cause it to conduct, however, and a positive pulse will be developed across the load 36 and can be taken from the output terminals 42.

The negative half of the input signal, when applied to the base 16 of the P–N–P transistor 8 will cause it to conduct. As is well known and understood, however, there is a 180° phase reversal between the collector and the base of a transistor connected for grounded emitter operation. Thus, the application of a negative signal to the base 16 of the P–N–P transistor 8 will cause a positive output signal in the output or collector circuit of this transistor. This positive pulse will also appear across the load 36 and can be taken from the output terminals 42. At the same time, a negative signal is applied to the base 26 of the N–P–N transistor 18 but it will remain non-conductive. Thus, by provision of the present invention there is a current flow in the load 36 in the same direction for both the negative and the positive half cycles of the applied signal, or in other words the frequency is doubled. Accordingly, signal having a frequency of $f_1$ when applied to the input terminals 28 will provide a signal having a frequency of $2f_1$ across the output terminals 42 in a push-push manner. Moreover, this result is achieved without the use of a push-pull input or driving source.

While it will be understood that the circuit specifications may vary according to the design for any particular application, the following circuit specifications are included for the circuit of Figure 1 by way of example only:

| | |
|---|---|
| Transistor **8** | RCA type 2N34 |
| Transistor **18** | RCA type 2N35. |
| Resistors **40** and **38** | 11,000 ohms each. |
| Battery **34** | 6 volts. |

When using the above circuit specifications the load 36 was chosen to be, for example, a resistor having a resistance of 6800 ohms.

As was mentioned hereinbefore, the present invention is in no way restricted to junction transistors and other types could be used. Thus, for example, in Figure 2, reference to which is now made, a frequency multiplier circuit of the same general type as the one illustrated in Figure 1 comprises a pair of unipolar transistors 48 and 58. For details on the construction and characteristics of transistors of this type, reference is made to an article by G. C. Dacey and I. M. Ross in the August 1953 issue of the "Proceedings of the I. R. E.," pages 970–979.

In general, each of the transistors 48 and 58 comprises a semi-conductive body having a so-called gate junction electrode which is somewhat analogous to and which will be referred to herein as a base electrode and two end electrodes which are in ohmic contact with the semi-conductive body. Thus, the transistor 48 comprises a semi-conductive body 50 of N-type conductivity material, a gate or base electrode 56 and two end electrodes 52 and 54. Similarly, the transistor 58 includes a semi-conductive body 60 of P type semi-conductive material, a base or gate electrode 66 and two end electrodes 62 and 64 which are in ohmic contact with the body 60. In the article referred to above the end electrodes 52 and 62 are designated as source electrodes, while the end electrodes 54 and 64 are designated as drain electrodes. For the sake of simplicity and uniformity of terminology, the electrodes 52 and 62 will be referred to herein as emitters, however, and the electrodes 54 and 64 will be referred to as collectors. Since the unipolar transistor has a symmetrical conduction characteristic, the designation of the end electrodes as emitters or source electrodes on the one hand and as collectors or drain electrodes on the other is essentially arbitrary. For convenience, however, the polarity of the biasing source is such that the electrodes 52 and 62 of the N type transistor 48 and the P type transistor 58 respectively will be designated as being emitter electrodes. The electrodes 54 and 64 will, on the other hand, be designated as being collector electrodes. If, however, the polarity of the biasing source is reversed, the designation of the end electrodes as being collector or emitter electrodes would have to be reversed.

Transistors of the unipolar type, in addition to their symmetrical conduction characteristic, are also characterized by their high frequency response. This is a result of the so-called unipolarity of such transistors, that is, that essentially only the majority carriers are involved in the operation of the device and provide conductivity from one end of the semi-conductive body to the other end. Unipolar transistors also have high input and output impedances.

The emitter 52 of the N type unipolar transistor is connected to the collector 64 of the P type unipolar transistor 58 and through the load 36 to the negative terminal of a source of biasing voltage, such as illustrated by a battery 67, the positive terminal of which is grounded as shown. As referred to above, the polarity of the biasing battery 67 could be reversed whereby the electrode 52 would be more properly designated as being a collector electrode, while the electrode 64 would be more properly designated as an emitter electrode. The collector 54 of the N type transistor 48 is connected directly to ground as shown, while the emitter electrode 62 of the P type transistor 58 is also connected directly to ground. Base bias for the transistor 48 is obtained by connecting a resistor 69 and a battery 68 in series between the base 56 and the collector 54 of the transistor 48, the positive terminal of the battery being connected with the collector 54. In much the same manner, a resistor 72 and a battery 70 are connected in series between the base 66 and the emitter 62 of the P type transistor 58. The biasing voltages are adjusted to a point such that negligible current can flow through each of the semi-conductive bodies from one end contact to the other end contact.

In other respects the circuit illustrated in Figure 2 is seen to be practically identical with the one which is illustrated in Figure 1. Accordingly, input signals are applied to the input terminals 28, one of which is grounded as shown, and the other of which is connected through a coupling capacitor 30 to the base 56 of the N type transistor 48, and also through the coupling capacitor 32 to the base 66 of the P type transistor 58. A signal having twice the frequency of the input signal may be taken from the output terminals 42.

In operation, the circuit illustrated in Figure 2 is quite similar to the one illustrated in Figure 1. Accordingly, the N type transistor 48 will conduct on the positive half cycle of the input signal, while the P type transistor 58 will conduct on the negative half cycle of an applied signal. When a positive signal is applied to the base of the N type transistor 48, a positive signal will flow through the load 36 and may be taken from the output terminals 42. The P type transistor 58 will remain nonconductive, however, when a positive signal is applied to its base 66. When the input signal goes negative, however, the P type transistor 58 will conduct and a positive signal will flow through the load. Hence, if the input signal has a frequency of $f_1$, the frequency of the output signal will be just twice that of the input signal or $2f_1$. Because the unipolar transistors have a symmetrical conduction characteristic, it is evident that the circuit connections for both the N and the P types are very similar. Hence, the circuit illustrated in Figure 2 is most suitable for applications where distortion should be minimized.

As described herein, it is evident that by using a pair of opposite conductivity transistors in accordance with this invention, a frequency multiplier circuit is possible which is relatively simple yet reliable and efficient. By utilizing opposite conductivity transistors in accordance with the invention, push-push frequency multiplier circuits are possible which may operate from a single ended source of signal energy. Hence, circuits in accordance with the invention are, in addition, relatively inexpensive.

What is claimed is:

1. In a frequency multiplier circuit, the combination with a pair of semi-conductor devices of opposite conductivity types, of signal input circuit means connecting said pair of devices effectively in parallel, circuit means providing a continuous conductive path through said devices serially, and means providing an output circuit connected with each of said devices, said signal input means providing a source of input signals of a predetermined frequency for rendering said devices alternately conductive to provide a corresponding push-push output signal of a frequency equal to twice said predetermined frequency.

2. A frequency multiplier circuit comprising, in combination, a first semi-conductor device of one conductivity type having a first input, a first output and a first common electrode, a second semi-conductor device of an opposite conductivity type having a second input, a second output and a second common electrode, means providing a source of input signals having a predetermined frequency and coupled with said first and second input electrodes, means connecting said first common electrode with said second common electrode, means directly connecting said first output electrode with said second output electrode, and output circuit means connected with said first and second output electrodes and providing push-push output signals of a frequency equal to twice said predetermined frequency.

3. A frequency multiplier circuit as defined in claim 2 wherein said output circuit means comprises a resistor.

4. A frequency multiplier circuit as defined in claim 2 wherein said output circuit means comprises an inductor.

5. A frequency multiplier circuit as defined in claim 2 wherein said output circuit means comprises a frequency selective circuit tunable to a frequency of an even multiple of said predetermined frequency.

6. In a frequency multiplier circuit including means providing a point of reference potential therein, the combination comprising, a first junction transistor having a first semi-conductive body of one conductivity type and a first emitter, a first collector and a first base electrode cooperatively associated therewith, a second junction transistor having a second semi-conductive body of an opposite conductivity type and a second emitter, a second collector and a second base electrode cooperatively associated therewith, means connecting said first emitter and said second collector electrode with said point of reference potential, means connecting said first collector electrode with said second emitter electrode, means providing a pair of input terminals for said circuit, means connecting one of said input terminals with said first and second base electrodes to impress an input signal of a predetermined frequency thereon, means providing energizing potentials to said first and second transistors, and output circuit means including a load device connected with said second emitter electrode for deriving an output signal of a frequency equal to twice said predetermined frequency.

7. A frequency multiplier circuit as defined in claim 6 wherein said first transistor is of the P–N–P junction type and said second transistor is of the N–P–N junction type.

8. A frequency multiplier circuit as defined in claim 6 wherein said first transistor is of the N–P–N junction type and said second transistor is of the P–N–P junction type.

9. A frequency multiplier circuit comprising, in combination, a first semi-conductor device of one conductivity type having a first input, a first output and a first common electrode, a second semi-conductor device of an opposite conductivity type having a second input, a second output and a second common electrode, means providing a source of input signals having a predetermined frequency and coupled with said first and second input electrodes, means providing a continuous direct current conductive path including said first common and first output electrodes and said second common and second output electrodes, and output circuit means connected with said first and second output electrodes and providing push-push output signals of a frequency equal to twice said predetermined frequency.

10. A frequency multiplier circuit as defined in claim 9 wherein said output circuit means comprises a load impedance element.

11. In a frequency multiplier circuit including means providing a point of reference potential therein, the combination comprising, a first unipolar transistor having a first semi-conductive body of one conductivity type and a first input, a first output and a first common electrode cooperatively associated therewith, a second unipolar transistor having a second semi-conductive body of an opposite conductivity type and a second input, a second output and a second common electrode cooperatively associated therewith, means connecting said first and second common electrodes with said point of reference potential, means connecting said first output electrode with said second output electrode, means providing a pair of input terminals for said circuit, means connecting one of said input terminals with said first and second input electrodes to impress an input signal of a predetermined frequency thereon, means providing energizing potentials for said first and second transistors, and output circuit means including a load device connected with said second output electrode for deriving an output signal of a frequency equal to twice said predetermined frequency.

12. A frequency multiplier circuit as defined in claim 11 wherein said first semi-conductive body is of N type conductivity and said second semi-conductive body is of P type conductivity.

13. In a frequency multiplier circuit, the combination with a pair of junction transistors of opposite conductivity types each of which includes a base, a collector and an emitter electrode, of means providing energizing potentials for said transistors, signal input circuit means connecting said pair of transistors effectively in parallel, circuit means providing a continuous conductive path including the emitter and collector electrodes of both of said transistors, and means providing an output circuit connected with the emitter electrode of one of said transistors, said signal input means providing a source of input signals of a predetermined frequency for rendering said transistors alternately conductive and providing a corresponding output signal of a frequency equal to twice said predetermined frequency.

14. A frequency multiplier circuit comprising, in combination, a first unipolar transistor of one conductivity type having a first base, a first output and a first common electrode, a second unipolar transistor of an opposite conductivity type having a second base, a second output and a second common electrode, means providing energizing potentials for said first and second transistors, means providing a source of input signals having a predetermined frequency and coupled with said first and second base electrodes, means connecting said first common electrode with said second common electrode, means connecting said first output electrode with said second output electrode, and an output circuit connected with said second output electrode and providing output signals of a frequency equal to twice said predetermined frequency.

References Cited in the file of this patent

UNITED STATES PATENTS 2,666,818 Shockley ---------------- Jan. 19, 1954

FOREIGN PATENTS 117,613 Australia ---------------- Oct. 12, 1943

OTHER REFERENCES

Article: "Duality as a Guide in Transistor Circuit Design" by Wallace et al. from Bell Telephone System Monograph 1874; April 1951.